Oct. 12, 1965 N. GREGORY ETAL 3,211,922

STRIP TRANSMISSION LINE HEAT RADIATOR

Filed Jan. 24, 1962

Nicholas Gregory

Linwood M. Moore

INVENTORS 3,211,922

STRIP TRANSMISSION LINE HEAT RADIATOR

Nicholas Gregory, Andover, Mass., and Linwood M. Moore, Nashua, N.H., assignors to Sanders Associates, Inc., Nashua, N.H., a corporation of Delaware Filed Jan. 24, 1962, Ser. No. 168,449
7 Claims. (Cl. 307—88.5)

Figure 1:
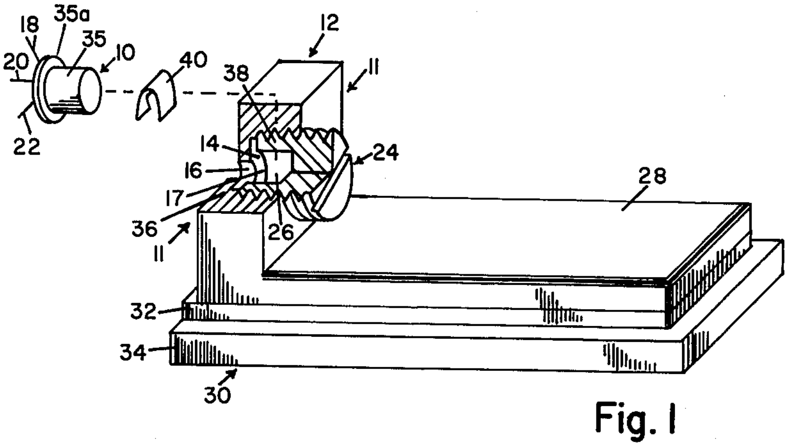

This invention relates to new and improved heat sinks for electronic devices and to improved high-frequency circuits incorporating them. More specifically, it relates to the use of transmission lines as heat sinks for electronic devices, and particularly for solid state devices such as transistors, to provide more efficient and reliable high-power, high frequency circuits.

According to the invention, a transistor, for example, may be mounted on the inner conductor of a resonant transmission line stub having an inner conductor connected to an outer conductor. The inner conductor provides a low-thermal resistance path to the heat-dissipating outer conductor so that heat generated in the transistor is quickly removed from it. This substantially increases the power-handling capacity of the transistor. In addition, the transmission line stub presents a high radio frequency impedance to the transistor so that, in the manner described below, more efficient transistor connections can be used in high frequency circuits.

It is well known that the internal resistances in electronic devices generate heat, which must be dissipated to prevent damage to the devices. Thus, the power ratings of these devices depend, in large part, on the efficiency with which the heat is dissipated therefrom. The heat transfer mechanisms inherent in these devices generally provide adequate dissipation for small-signal operations. However, in most applications, additional cooling must be provided.

Heat dissipation problems are more acute with recently developed miniature electronic devices, particularly with solid state devices such as transistors and tunnel diodes in which internal heating takes place in small junction regions. The concentration of heat at the junction regions causes the temperature to increase drastically unless the heat is rapidly removed.

These problems have resulted in the development of relatively bulky heat sinks that generally have a plurality of radiating fins to provide large surface areas from which the heat can be dissipated by radiation and convection. However, the finned heat sinks introduce stray reactances, generally capacitive, that interfere with efficient circuit operation.

Furthermore, prior heat sinks do not provide both the desired degree of electrical isolation between the electronic device and ground, and a low thermal-resistance heat path from the device to the heat sink. For example, transistors are commonly constructed with the collector terminal connected to a metallic case, so that when the transistor is mounted on a conventional heat sink the collector terminal is grounded. Accordingly, high-power transistor circuits, in the prior art, are restricted to the use of a grounded-collector connection. However, for many applications the low gain and the output impedance inherent in grounded-collector circuits are inefficient. To use a more efficient transistor circuit, such as a grounded-emitter arrangement, an electric insulator, such as beryllium oxide, is disposed between the transistor and the conventional heat sink. Since electric insulators are relatively poor thermal conductors, a substantial heat gradient develops across the insulator, and the temperature of transistor case is substantially above the temperature of the heat sink. This materially limits the power handling ability of the transistor.

Accordingly, it is a principal object of the present invention to provide improved high-power, high frequency circuits.

A further object of the invention is to provide a heat sink system that provides a low thermal-resistance path and a relatively high radio-frequency impedance to the heat source.

Still another object of the invention is to provide a high frequency circuit construction having a negligible temperature gradient between heat-generating electronic devices incorporated therein and the environment.

Yet another object is to provide an improved heat sink for use in high-frequency electronic circuits.

A more specific object is to provide an efficient heat sink for use with grounded-emitter transistor circuits or grounded base.

Yet another object of the invention is to provide higher frequency operation than previously practical in high-power circuits incorporating solid state devices. A corollary object is to provide a heat sink that introduces a minimum reactance in the circuit.

Further objects of the invention include the provision of simpler and more reliable high-frequency high-power circuits than heretofore available.

Other objects of the invention will in part be obvious and will in part appear hereinafter.

The invention accordingly comprises the features of construction, combinations of elements, and arrangements of parts which will be exemplified in the constructions hereinafter set forth, and the scope of the invention will be indicated in the claims.

Figure 2:
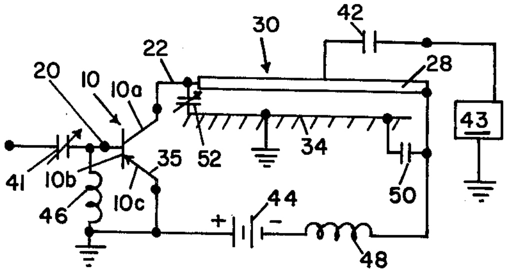
Figure 3:
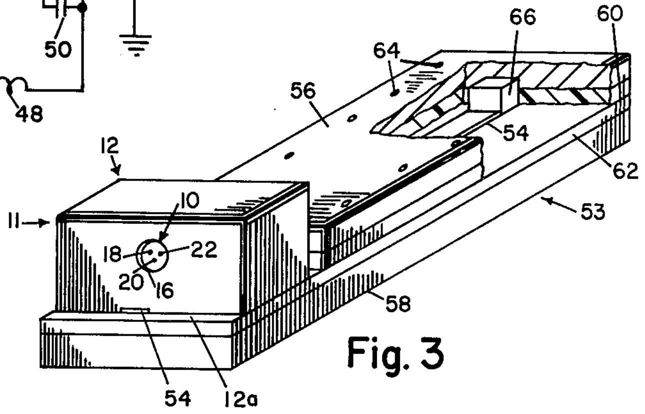
Figure 4:
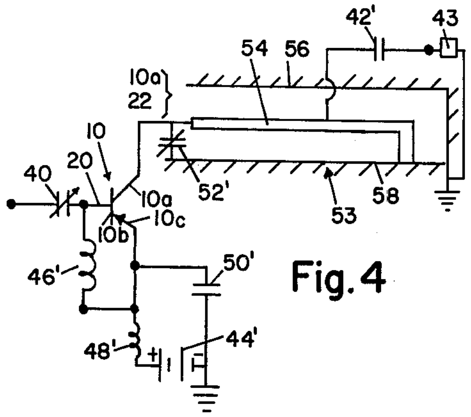

For a fuller understanding of the nature and objects of the invention, reference should be had to the following detailed description taken in connection with the accompanying drawings in which:

FIG. 1 is a perspective view, partly broken away and exploded, of a heat sink embodying features of the invention, FIG. 2 is a schematic diagram of a high frequency circuit embodying the invention, FIG. 3 is a perspective view, partly broken away, of another heat sink embodying the invention, and FIG. 4 is a schematic representation of another high frequency circuit incorporating the invention.

In general, the invention utilizes the large conducting surfaces of transmission lines, particularly strip transmission lines, to dissipate the heat generated in electronic devices, especially in solid state devices such as transistors. The transistor is mounted directly on the transmission line inner conductor and the line is terminated to present a desired output impedance to the transistor. The output signal from the transistor is tapped from the inner conductor intermediate the transistor connection and the termination, whereby a wide range of load impedances can be matched to the transistor.

The heat sink is particularly suited for construction with strip transmission line, due to the planar arrangement of the conductors therein. With open strip line, for example, the exposed inner conductor radiates heat, thereby maintaining the temperature of the transistor substantially the same as the environment. With a closed transmission line, the inner conductor, connected to the outer conductor at a distance of one-quarter wavelength or less from the connection with the transistor, provides a high heat-conductivity path from the transistor to the heat-dissipating outer conductor. The short-circuited transmission line may be resonated to present a relatively high impedance to the transistor. Thus, when the collector terminal of the transistor is internally connected to the transistor case, a high radio-frequency impedance is developed between the collector and ground. This allows the use of an efficient grounded-emitter circuit, and thus, high gain transistor circuits can be used in high-power high-frequency circuits.

More specifically, referring to FIG. 1, a high-frequency heat sink, for a transistor indicated generally at 10, has a mount 11 comprising a mounting block 12 formed with a threaded cavity 14 and a hole 16 that extends from the cavity through a wall 17 in the block. The cavity is shaped to accommodate the transistor, with the emitter lead 18, base lead 20 and collector lead 22 protruding through the hole 16.

A screw indicated at 24, provided with an axial bore 26, threads into the cavity to clamp the transistor in place against the wall 17. The block 12 and the screw 24 are made of material, such as copper, having high electrical and thermal conductivities, and thus they are adapted to maintain a close heat exchange relationship with the transistor to efficiently remove the heat it develops.

The block 12 is in close thermal relationship to an inner conductor 28 of an open strip transmission line, indicated at 30. The line 30 also includes an insulator 32 and a ground plane or outer conductor 34. The conductors 28 and 34 are preferably parallel to each other, and the width of the inner conductor 28 and its spacing from the outer conductor 34 are selected to provide the desired transmission line impedance. The inner conductor 28, which is exposed to the environment, efficiently radiates the heat transferred to it from the transistor 10 by the block 12, thus preventing an undue rise in the temperature of the transistor.

As explained below in greater detail, when the transmission line is terminated with a low electrical impedance properly spaced from the connection to the mount 11, it presents a high impedance between the mount 11 and the grounded outer conductor 34. Accordingly, a transistor manufactured with its collector internally connected to its case can be secured in the mount 11 for efficient heat dissipation and yet be connected in a circuit requiring an ungrounded collector. This combination of a high thermal-conductivity path from a transistor case to a grounded heat dissipating member, and a relatively high electrical impedance between the case and the dissipating member is not commercially practical in the prior art.

Still referring to FIG. 1, the case 35 of the transistor 10 is internally connected to the collector of the transistor (not shown in FIG. 1). It is seated against the wall 17 in the assembled unit and has a rim **35*a* engaged by an annular foot 38 of the screw 24. A spring 40, of high conductivity material such as beryllium copper, may be compressed in the bore 26 between the transistor and the screw to hold the transistor in place more firmly and also to increase the transfer of heat from the transistor to the block 12. Additional resilient heat-conductors (not shown) may be compressed between the sides of the transistor case 35 and the cylindrical wall of the bore 26** to further enhance the transfer of heat from the transistor.

Since the mount 11 is small, for example ¼ by ½ by ½ inches, it has substantially the same size and weight as conventional transistor sockets. However, its high heat-transfer efficiency maintains the top temperature gradient between the transistor case 35 and the conductor 28 as low as 4° C., whereas a grounded-emitter transistor mounted on beryllium oxide and a heat sink, according to prior techniques, is typically 30° C. hotter than the environmental temperatures at the heat sink. By thus reducing the transistor's operating temperature, the transistor life and circuit reliability are substantially increased.

In addition to providing an efficient heat sink, the construction shown in FIG. 1 makes it possible to use a grounded-emitter connection in high-power, high-frequency circuits, as illustrated by the amplifier of FIG. 2, where the heat sink is represented schematically by the inner conductor 28 and the outer conductor 34. The transistor 10 is mounted in the block 12 (FIG. 1) which connects the collector **10*a* to the inner conductor 28**.

The amplifier input signal is fed in at the base **10*b* through a blocking capacitor 41, and the output signal to a load 43 is tapped off from the inner conductor 28 through a blocking capacitor 42. A voltage source, indicated as a battery 44, is connected to bias the collector 10*a* through the inner conductor 28. The D.-C. base current is returned to ground through an inductor 46, across which the amplifier input voltage is developed; and a series inductor 48, together with a shunt capacitor 50, isolates the battery 44 from high frequency output signals. The emitter 10*c*** is grounded.

Still referring to FIG. 2, the shunt capacitor 50 has a relatively high capacitance and thus presents a low radio-frequency impedance between the inner conductor 28 and the outer conductor 34. The length of the transmission line between the capacitor 50 and the transistor collector **10*a* is preferably less than a quarter wavelength at the operating frequency so that the low capacitor 50 impedance appears as an inductive reactance at the transistor. More specifically, the line 30 might be replaced schematically by an inductor connected between the lead 22 and ground. A capacitor 52, connected in parallel with this inductive element, is tuned to resonate with it at the signal frequency. The parallel resonance, in turn, isolates the collector 10*a* from ground at this frequency. The point at which the load 43 is tapped on the conductor 28** determines the output impedance of the amplifier.

Thus, the transmission line 30, in addition to providing a large heat radiating surface, presents an adjustable, relatively high impedance between the collector **10*a*** and ground, thereby allowing the transistor to be operated with the grounded-emitter connection.

Using the present heat sink with a grounded-emitter circuit, power levels three or four times greater than those possible without the heat sink are attainable and 50 to 70% greater power levels are possible than with prior heat sinks. Furthermore, the stray reactance, generally capacitive, common to prior heat sinks is avoided with the present construction, since the capacitance of the mount 11 is now part of the transmission line 30. This allows higher frequency operation of the transistor 10 than with prior heat sinks, wherein capacitive reactances become excessive at such frequencies.

A further advantage of our system stems from the fact that the impedance of the resonant circuit at off-resonant frequencies is determined by the characteristic impedance of the transmission line. More specifically, it decreases as the characteristic impedance decreases, and thus, by using a low characteristic impedance, one may obtain low-off resonance impedances. This, in turn, provides a large impedance mismatch with the transistor at such frequencies and effectively prevents spurious oscillations. Also, the low impedance prevents the generation of high reactive voltages which might damage the transistor.

It will be noted that a low characteristic impedance corresponds to a large transmission line inner conductor and excellent heat-transfer capability. It also corresponds to a high Q for the tuned circuit because of the lower resistance of the inner conductor. A characteristic impedance of 50–70 ohms has been found to be highly practical.

The impedance characteristics of a quarter-wavelength line (eliminating the tuning capacitor) may make this length desirable in some applications. However, we have found that a substantially shorter line is generally preferable. For example, at 160 megacycles, we prefer to use a line as short as 1/32 wavelength. In the construction of FIG. 3, this provides a short path for heat flow and also results in a much less bulky package. Moreover, as the line length is decreased and the capacitance of the tuning capacitor increased, the maximum voltage for a given Q is decreased, thereby permitting safe operation of the transistor at a higher Q. A higher Q is generally inherent in the short construction.

Referring now to FIG. 3, the heat sink may also be incorporated in a closed strip transmission line, indicated at 53, that comprises an inner conductor 54 disposed substantially midway between and parallel to a pair of ground plane outer conductors 56 and 58. Insulators 60 and 62 are disposed between the inner conductor and the respective outer conductors. Conducting means, such as pins 64—64, are connected between the outer conductors 56 and 58 to maintain the outer conductors at substantially the same potential and thus suppress undesirable transmission modes, according to well-known techniques.

In FIG. 3, the transistor 10 may be secured in a mount 11 similar to the one described above with reference to FIG. 1. The outer conductor 56 and insulator 60 are cut back from the inner conductor 54 to expose a length thereof for connection to the block 12 along the bottom surface 12*a* thereof. At the end of the transmission line remote from the mount, a conducting member 66 short circuits the inner conductor to the outer conductors 56 and 58. With this construction, the heat developed in the transistor 10 is transferred to the mount 11 and then through the inner conductor 54 and member 66 to the outer conductors, which have large surfaces that radiate the heat to the environment. Thus, the inner conductor 54 provides a highly heat-conductive path for the transfer of heat from the block 10 to the outer conductors 56 and 58.

As shown in FIG. 4, the closed transmission line of FIG. 3 can be incorporated in an efficient high-power amplifier similar to the amplifier of FIG. 2. Accordingly, the amplifier of FIG. 4 has an input capacitor 40′, an output capacitor 42′, and inductors 46′ and 48′. A battery 44′ is connected to power the transistor, and the inductor 48′ and a blocking capacitor 50′ are connected to bypass high frequency signals around the battery. A load 43′ is tapped along the line 53 by means of the capacitor 42′. The circuit of FIG. 4 differs slightly from that of FIG. 2 because of the direct connection between the outer conductors 56 and 58 and the inner conductor 54.

The short circuited transmission line 53 is resonated with a capacitor 52′ to isolate the collector 10*a* from ground, as described above. Thus, as in FIG. 2, the transmission line heat sink combines an ungrounded collector with respect to the RF energy but not the voltage with a highly heat-conductive path between the transistor and heat-dissipating conductors.

In summary, each of the heat sinks of the present invention incorporates a transmission line tuned to present a selected impedance to an electronic component secured to its inner conductor. There is high thermal conductivity between the component and the inner conductor, which may serve as a heat sink itself or conduct the heat to an outer conductor-heat sink. Thus, our construction provides efficient heat dissipation from the component, combined with electrical isolation from the heat sink, to make possible improved high-power electronic circuits. Since the transmission lines perform dual functions, the improved circuits can be simply constructed with a minimum number of components.

Having thus described our invention, what we claim as new and desire to secure by Letters Patent is:

1. A heat sink for a heat-generating electrical component having a metallic housing, said heat sink comprising, in combination, a transmission line having a first conductor physically isolated from a second conductor thereof at least at a first end thereof, a mount contacting said first conductor at said first end, said mount supporting said metallic housing to provide high conductance electrical and heat paths between said housing and said first conductor, said transmission line's length and the characteristics of its termination at the end remote from said first end being such as to present a reactance at said first end, said combination including a reactance element electrically connected across said line's first and second conductors at said first end which will resonate with said reactance at the operating frequency of said electronic component.

2. A heat sink for an electronic component operated at high frequencies, said heat sink comprising in combination, a transmission line having an inner conductor and an outer conductor, a mount having high thermal and electrical conductivities disposed contiguous to said inner conductor, said mount supporting said component with low-resistance thermal and electrical communication with said inner conductor, and high thermal conductivity means connecting said inner conductor to said outer conductor at a point remote from said component, whereby heat developed in said component is efficiently transferred successively by said mount, inner conductor and high conductivity means to said outer conductor.

3. A heat sink for electronic devices having electrical leads operated at high frequencies, said heat sink comprising, in combination, a transmission line having an inner conductor and an outer conductor having a first end, a mounting block having high thermal and electrical conductivities disposed contiguous to said inner conductor, means forming a threaded internal cavity part way through said block and a hole extending from said cavity through said block, a screw adapted to mate with said threaded cavity, means forming an axial bore in said screw, said mounting block and said screw being shaped to secure said electronic device in said cavity and bore with said leads of said component extending from said cavity through said hole, whereby said electronic device is secured in a high heat-exchange relation with said block, the length of said line and the characteristic of its termination at the end remote from said first end are such as to present a reactance at said first end, said combination including a reactance element electrically connected across said inner and outer conductor at said first end which will resonate with said reactance at the operating frequency of said electronic device.

4. In a high frequency electronic circuit including a transistor having a collector electrode and a case electrically interconnected the combination comprising a transmission line having an inner conductor and an outer conductor, a transistor mount connecting said transistor to said inner conductor in a high heat exchange relationship and with substantially negligible electrical impedance between said case and inner conductor, said transmission line having a said collector electrode electrically connected to said inner conductor to present at the operating frequency of said transistor a selected transmission line impedance between said collector electrode and said outer conductor, high thermal conductivity means electrically connecting said inner conductor to said outer conductor at an end of said line remote from said transistor.

5. A high frequency circuit comprising, in combination, a transistor having a case and a collector, said collector being connected to the case of said transistor, a transmission line having an outer conductor and an inner conductor, a transistor mount having high thermal and electrical conductivity connecting said transistor to said inner conductor with said transistor case in high heat exchange relation with said inner conductor, a low impedance element connected between said inner and outer conductors at an electrical distance between an eighth and a quarter wavelength from the connection of said mount to said transmission line at the operating frequency of said transistor so that said line presents an inductive reactance between said collector and said outer conductor, a capacitor electrically connected across said inner and outer conductors to substantially resonate said inductive reactance, whereby a selected impedance is presented to said transistor between said collector and said outer conductor.

6. The combination defined in claim 5 in which said low-impedance element is a capacitor.

7. The combination defined in claim 5 including an electrical load, means coupling said load to said inner conductor at a point intermediate said transistor and said low-impedance element.

References Cited by the Examiner

UNITED STATES PATENTS

| | | | |
|---|---|---|---|
| 2,611,822 | 9/52 | Bliss | 331—99 |
| 2,994,203 | 8/61 | Lackey et al. | 317—100 |

ARTHUR GAUSS, *Primary Examiner.*